US012757794B2

(12) United States Patent
Müller et al.

(10) Patent No.: US 12,757,794 B2
(45) Date of Patent: Oct. 6, 2026

(54) SEMICONDUCTOR MODULE ARRANGEMENT

(71) Applicant: Infineon Technologies AG, Neubiberg (DE)

(72) Inventors: Christian Müller, Schweinfurt (DE); Jan Baurichter, Paderborn (DE)

(73) Assignee: Infineon Technologies AG, Neubiberg (DE)

( * ) Notice: Subject to any disclaimer, the term of this patent is extended or adjusted under 35 U.S.C. 154(b) by 400 days.

(21) Appl. No.: 18/521,372

(22) Filed: Nov. 28, 2023

(65) Prior Publication Data

US 2024/0203950 A1 Jun. 20, 2024

(30) Foreign Application Priority Data

Dec. 16, 2022 (DE) ......................... 102022133675.1

(51) Int. Cl.

*H10W 90/00* (2026.01)
*H10W 70/65* (2026.01)
*H10W 70/685* (2026.01)
*H10W 72/00* (2026.01)
*H10W 72/30* (2026.01)
*H10W 72/50* (2026.01)

(52) U.S. Cl.

CPC ......... *H10W 90/00* (2026.01); *H10W 70/658* (2026.01); *H10W 70/685* (2026.01); *H10W 90/701* (2026.01); *H10W 72/884* (2026.01); *H10W 90/734* (2026.01); *H10W 90/754* (2026.01)

(58) Field of Classification Search

None

See application file for complete search history.

(56) References Cited

U.S. PATENT DOCUMENTS

2006/0290689 A1 12/2006 Grant et al.
2024/0030211 A1* 1/2024 Nogawa ................ H10W 90/00

FOREIGN PATENT DOCUMENTS

DE 112013001234 T5 1/2015
DE 102019112934 A1 11/2020
DE 102019112936 A1 11/2020
EP 0828341 A2 3/1998
EP 3955290 A1 2/2022

* cited by examiner

*Primary Examiner* — Timothy J Thompson
*Assistant Examiner* — Amol H Patel
(74) *Attorney, Agent, or Firm* — Harrity & Harrity, LLP

(57) ABSTRACT

A power semiconductor module arrangement includes a substrate including a dielectric insulation layer and a first metallization layer arranged on a first side of the dielectric insulation layer, wherein the first metallization layer includes a plurality of different sections that are separate and distinct from each other, and a plurality of semiconductor bodies arranged on the first metallization layer, and including a first sub-group of semiconductor bodies and a second sub-group of semiconductor bodies, wherein the semiconductor bodies of the first sub-group differ from the semiconductor bodies of the second sub-group, wherein each of the plurality of semiconductor bodies includes a control electrode and a controllable load path between a first load electrode and a second load electrode, the first sub-group is symmetrical to the second sub-group.

17 Claims, 4 Drawing Sheets

SEMICONDUCTOR MODULE ARRANGEMENT

CROSS-REFERENCE TO RELATED APPLICATION

This application claims priority to German Patent Application No. 102022133675.1 filed on Dec. 16, 2022, the content of which is incorporated by reference herein in its entirety.

TECHNICAL FIELD

The instant disclosure relates to a semiconductor module arrangement.

BACKGROUND

Power semiconductor module arrangements often include at least one semiconductor substrate arranged in a housing. A semiconductor arrangement including a plurality of controllable semiconductor elements (e.g., IGBTs, MOSFETs, HEMTs, etc.) is arranged on each of the at least one substrate. Each substrate usually comprises a substrate layer (e.g., a ceramic layer), a first metallization layer deposited on a first side of the substrate layer, and, optionally, a second metallization layer deposited on a second side of the substrate layer. The controllable semiconductor elements are mounted, for example, on the first metallization layer. The second metallization layer may optionally be attached to a base plate. The layout of the semiconductor arrangement should be chosen to minimize the required size of the at least one substrate while, at the same time, preventing an unequal distribution of current densities, electrical losses, and thermal stress.

There is a need for a power semiconductor module arrangement that provides an equal distribution of current densities, electrical losses, and thermal stress, while requiring a minimum of space on a substrate.

SUMMARY

A power semiconductor module arrangement includes a substrate including a dielectric insulation layer and a first metallization layer arranged on a first side of the dielectric insulation layer, wherein the first metallization layer includes a plurality of different sections that are separate and distinct from each other, and a plurality of semiconductor bodies arranged on the first metallization layer, and including a first sub-group of semiconductor bodies and a second sub-group of semiconductor bodies, wherein the semiconductor bodies of the first sub-group differ from the semiconductor bodies of the second sub-group, wherein each of the plurality of semiconductor bodies includes a control electrode and a controllable load path between a first load electrode and a second load electrode, the first load electrode of each of the plurality of semiconductor bodies is electrically coupled to a first section of the first metallization layer, the second load electrodes of the semiconductor bodies of the first sub-group are electrically coupled to a second section, and the second load electrodes of the semiconductor bodies of the second sub-group are electrically coupled to a third section of the first metallization layer, the control electrodes of the semiconductor bodies of the first sub-group are electrically coupled to a fourth section, and the control electrodes of the semiconductor bodies of the second sub-group are electrically coupled to a fifth section of the first metallization layer, the first sub-group is symmetrical to the second sub-group.

The implementation may be better understood with reference to the following drawings and the description. The components in the figures are not necessarily to scale, emphasis instead being placed upon illustrating the principles of the implementation. Moreover, in the figures, like referenced numerals designate corresponding parts throughout the different views.

DETAILED DESCRIPTION

In the following detailed description, reference is made to the accompanying drawings. The drawings show specific examples in which the implementation may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (e.g., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
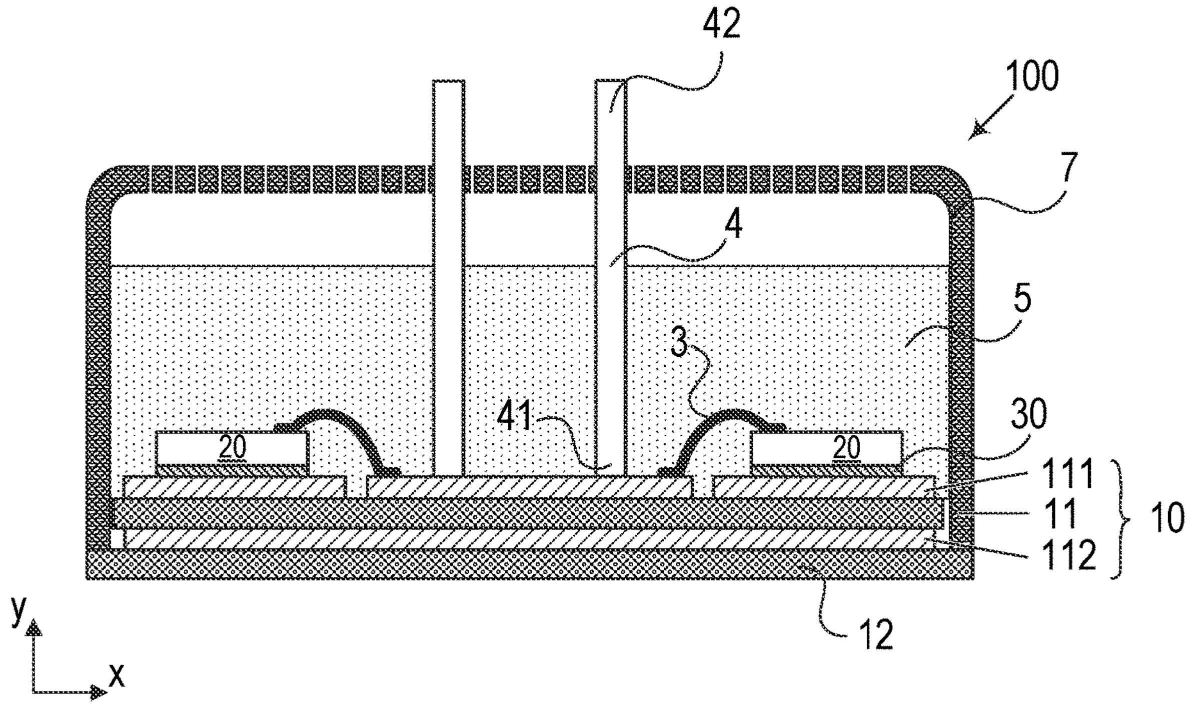
FIG. 1 is a cross-sectional view of a power semiconductor module arrangement.

Referring to FIG. 1, a cross-sectional view of a power semiconductor module arrangement 100 is schematically illustrated. The power semiconductor module arrangement 100 includes a housing 7 and a substrate 10. The substrate 10 includes a dielectric insulation layer 11, a (structured) first metallization layer 111 attached to the dielectric insulation layer 11, and a (structured) second metallization layer

112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. The substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $SiO_2$, $Al_2O_3$, AlN, or BN and may have a diameter of between about 1 μm and about 50 μm. The substrate 10 may also be a conventional printed circuit board (PCB) having a non-ceramic dielectric insulation layer 11. For instance, a non-ceramic dielectric insulation layer 11 may consist of or include a cured resin.

The substrate 10 is arranged in a housing 7. In the example illustrated in FIG. 1, the substrate 10 is arranged on a base plate 12 which forms a ground surface of the housing 7, while the housing 7 itself solely comprises sidewalls and a cover. This, however, is only an example. It is also possible that the housing 7 further comprises a ground surface and the substrate 10 and the base plate 12 be arranged inside the housing 7. In some power semiconductor module arrangements 100, more than one substrate 10 is arranged on a single base plate 12 or on the ground surface of a housing 7. It is also possible that the substrate 10 itself forms a ground surface of the housing 7.

One or more semiconductor bodies 20 may be arranged on the at least one substrate 10. Each of the semiconductor bodies 20 arranged on the at least one substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), and/or any other suitable semiconductor element.

The one or more semiconductor bodies 20 may form a semiconductor arrangement on the substrate 10. In FIG. 1, only two semiconductor bodies 20 are exemplarily illustrated. The second metallization layer 112 of the substrate 10 in FIG. 1 is a continuous layer. The first metallization layer 111 is a structured layer in the example illustrated in FIG. 1. "Structured layer" means that the first metallization layer 111 is not a continuous layer, but includes recesses between different sections of the layer. Such recesses are schematically illustrated in FIG. 1. The first metallization layer 111 in this example includes three different sections. This, however, is only an example. Any other number of sections is possible. Different semiconductor bodies 20 may be mounted to the same or to different sections of the first metallization layer 111. Different sections of the first metallization layer 111 may have no electrical connection or may be electrically connected to one or more other sections using electrical connection elements 3 such as, e.g., bonding wires or bonding ribbons. Electrical connections 3 may also include connection plates, conductor rails, or connection clips, for example, to name just a few examples. The one or more semiconductor bodies 20 may be electrically and mechanically connected to the substrate 10 by an electrically conductive connection layer 30. Such an electrically conductive connection layer 30 may be a solder layer, a layer of an electrically conductive adhesive, or a layer of a sintered metal powder, e.g., a sintered silver powder, for example. According to other examples, it is also possible that the second metallization layer 112 is a structured layer. It is further possible to omit the second metallization layer 112 altogether.

The power semiconductor module arrangement 100 illustrated in FIG. 1 further includes terminal elements 4. The terminal elements 4 are electrically connected to the first metallization layer 111 and provide an electrical connection between the inside and the outside of the housing 7. The terminal elements 4 may be electrically connected to the first metallization layer 111 with a first end 41, while a second end 42 of each of the terminal elements 4 protrudes out of the housing 7. The terminal elements 4 may be electrically contacted from the outside at their respective second ends 42. A first part of the terminal elements 4 may extend through the inside of the housing 7 in a vertical direction y. The vertical direction y is a direction perpendicular to a top surface of the substrate 10, wherein the top surface of the substrate 10 is a surface on which the at least one semiconductor body 20 is mounted. The terminal elements 4 illustrated in FIG. 1, however, are only examples. Terminal elements 4 may be implemented in any other way and may be arranged anywhere within the housing 7. For example, one or more terminal elements 4 may be arranged close to or adjacent to the sidewalls of the housing 7. Terminal elements 4 could also protrude through the sidewalls of the housing 7 instead of through the cover. The first end 41 of a terminal element 4 may be electrically and mechanically connected to the substrate 10 by an electrically conductive connection layer, for example (not explicitly illustrated in FIG. 1). Such an electrically conductive connection layer may be a solder layer, a layer of an electrically conductive adhesive, or a layer of a sintered metal powder, e.g., a sintered silver (Ag) powder, for example. The first end 41 of a terminal element 4 may also be electrically coupled to the substrate 10 via one or more electrical connections 3, for example.

The power semiconductor module arrangement 100 may further include an encapsulant 5. An encapsulant 5 may consist of or include a silicone gel or may be a rigid molding compound, for example. The encapsulant 5 may at least partly fill the interior of the housing 7, thereby covering the components and electrical connections that are arranged on the substrate 10. The terminal elements 4 may be partly embedded in the encapsulant 5. At least their second ends 42, however, are not covered by the encapsulant 5 and protrude from the encapsulant 5 through the housing 7 to the outside of the housing 7. The encapsulant 5 is configured to protect the components and electrical connections of the power semiconductor module 100, in particular the components arranged on the substrate 10 inside the housing 7, from certain environmental conditions and mechanical damage.

Figure 2:
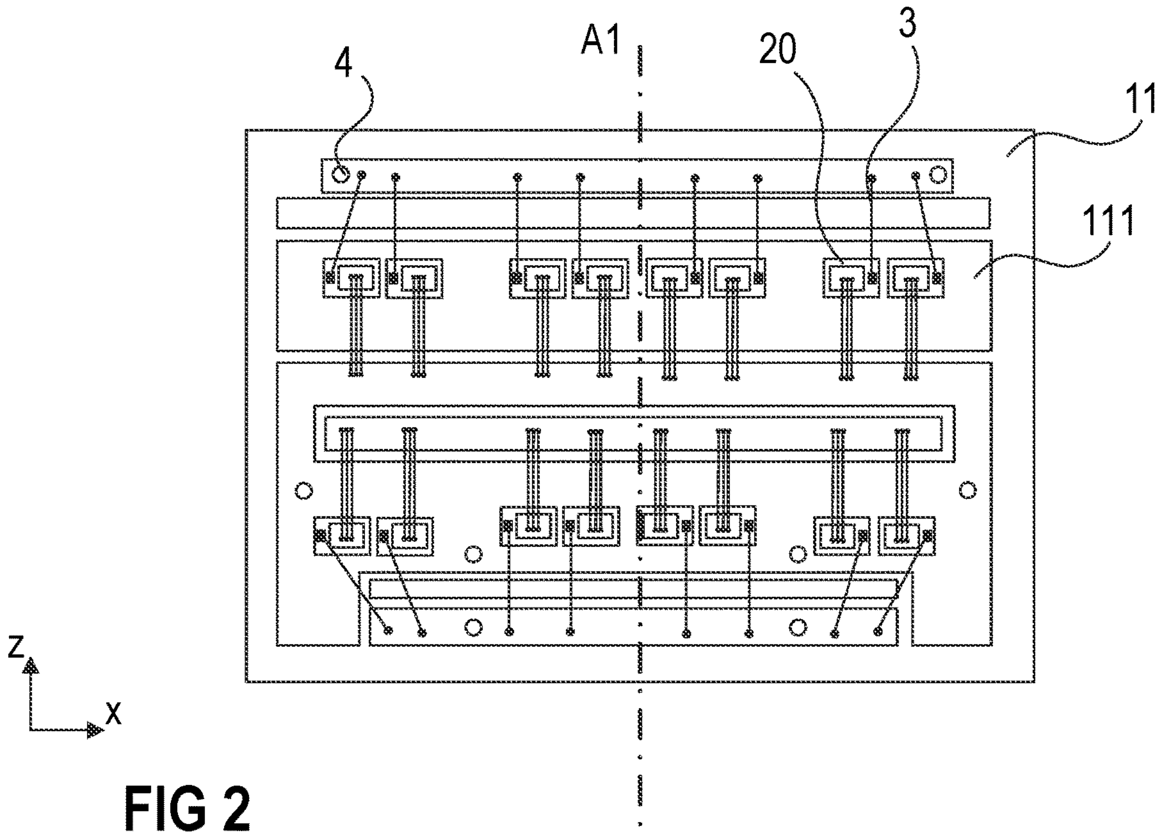
FIG. 2 is a top view of a semiconductor arrangement.

Now referring to FIG. 2, a semiconductor arrangement is schematically illustrated. In particular, FIG. 2 schematically illustrates a top view of a substrate comprising a dielectric insulation layer 11 and a first metallization layer 111 with semiconductor bodies 20 mounted thereon, similar to what has been described with respect to FIG. 1 above. The first metallization layer 111 is a structured metallization layer comprising a plurality of different sections. Different semiconductor bodies 20 are mounted on different sections of the first metallization layer 111. The semiconductor bodies 20 are arranged symmetrically about an axis of symmetry A1. Such a (electrically) symmetrical design is advantageous, for example, with respect to switching characteristics and thermal performance. The arrangement, however, requires a lot of space. In particular, as can be seen in FIG. 2, there is a lot of free space between the different semiconductor bodies 20 in order to implement the symmetrical design. That is, a packing density of the semiconductor bodies 20 on the substrate 10 is comparably low. Therefore, a large substrate 10 needs to be provided to accommodate the semiconductor arrangement.

Figure 3:
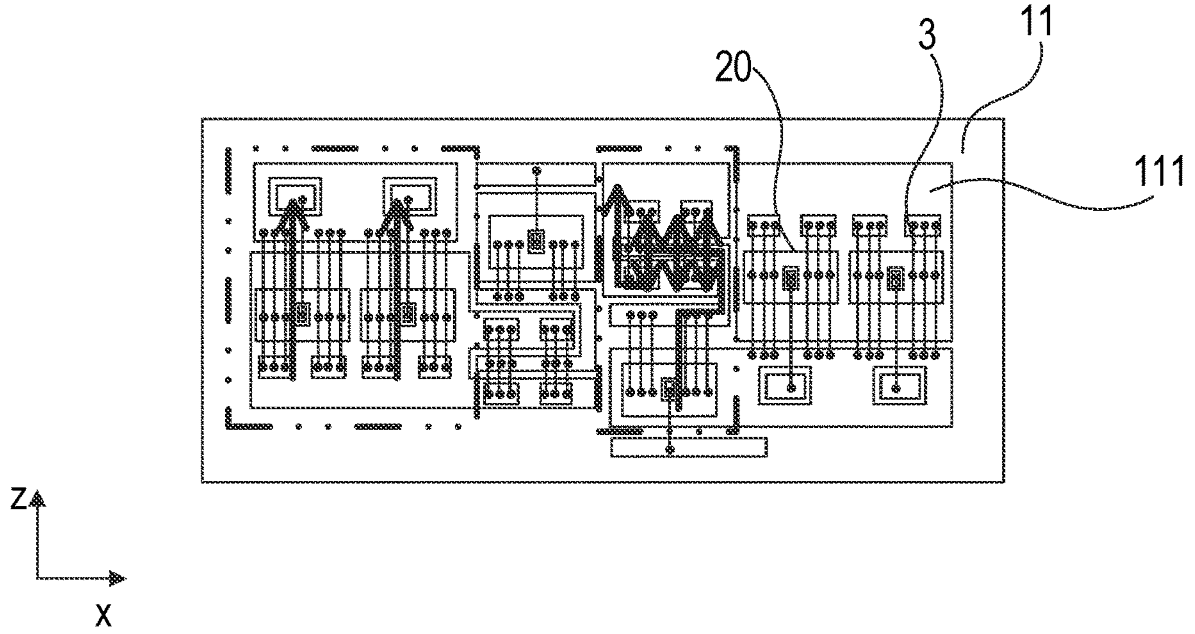
FIG. 3 is a top view of another semiconductor arrangement.

Now referring to FIG. 3, another semiconductor arrangement is schematically illustrated. In particular, FIG. 3 schematically illustrates a top view of another substrate comprising a dielectric insulation layer 11 and a first metallization layer 111 with semiconductor bodies 20 mounted thereon, similar to what has been described with respect to FIG. 1 above. The first metallization layer 111 is a structured metallization layer comprising a plurality of different sections. Different semiconductor bodies 20 are mounted on different sections of the first metallization layer 111. The design in this case is not symmetrical. Instead, the semiconductor bodies 20 are arranged at a higher density. That is, the semiconductor arrangement requires less space as compared to the arrangement as has been described with respect to FIG. 2 above. As is indicated with the bold arrows in FIG. 3, the distribution of the currents in this case is highly asymmetrical. This asymmetry generally needs to be compensated using additional semiconductor elements. Additional semiconductor elements, however, increase the overall costs of the power semiconductor module.

Figure 4:
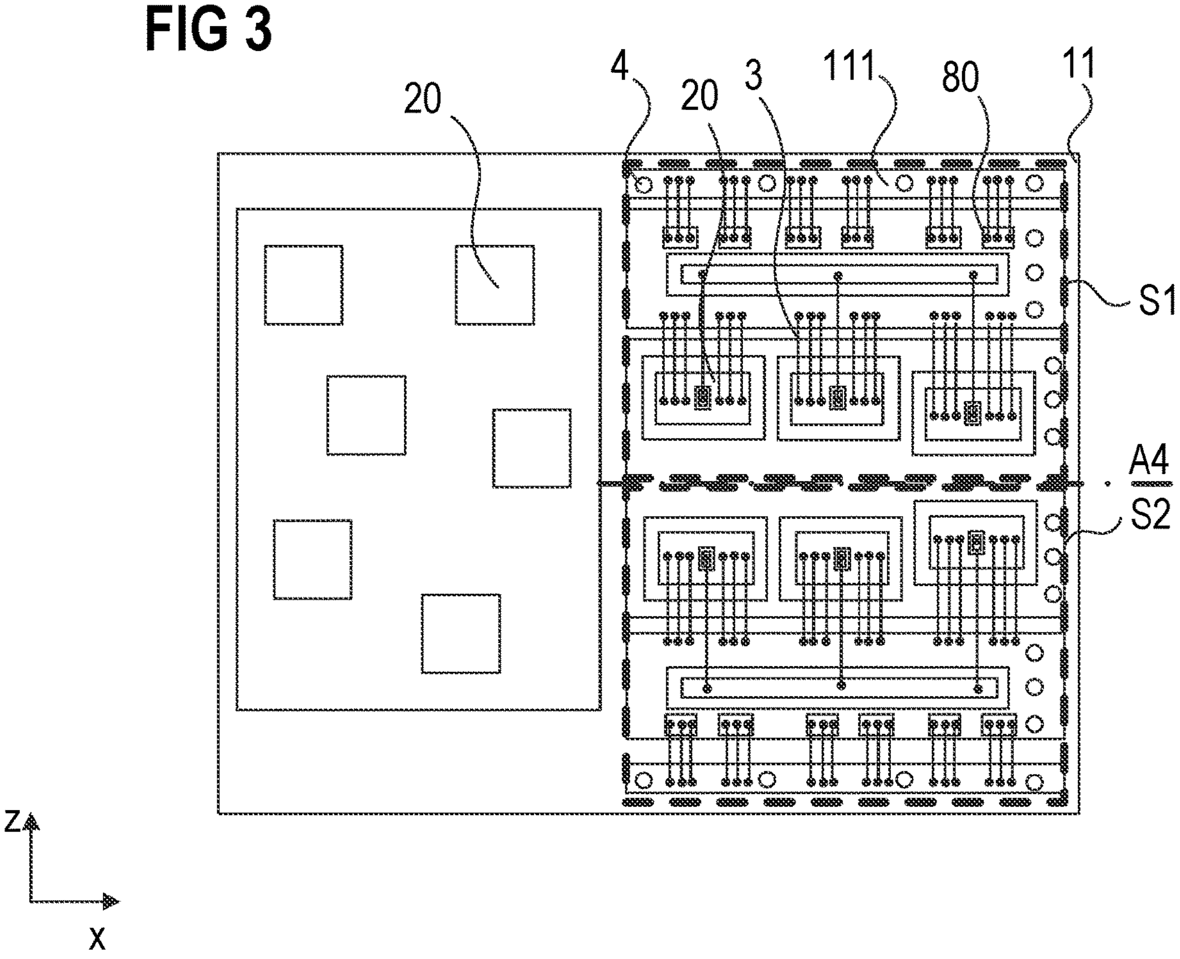
FIG. 4 is a top view of a semiconductor arrangement according to one or more implementations.
Figure 5:
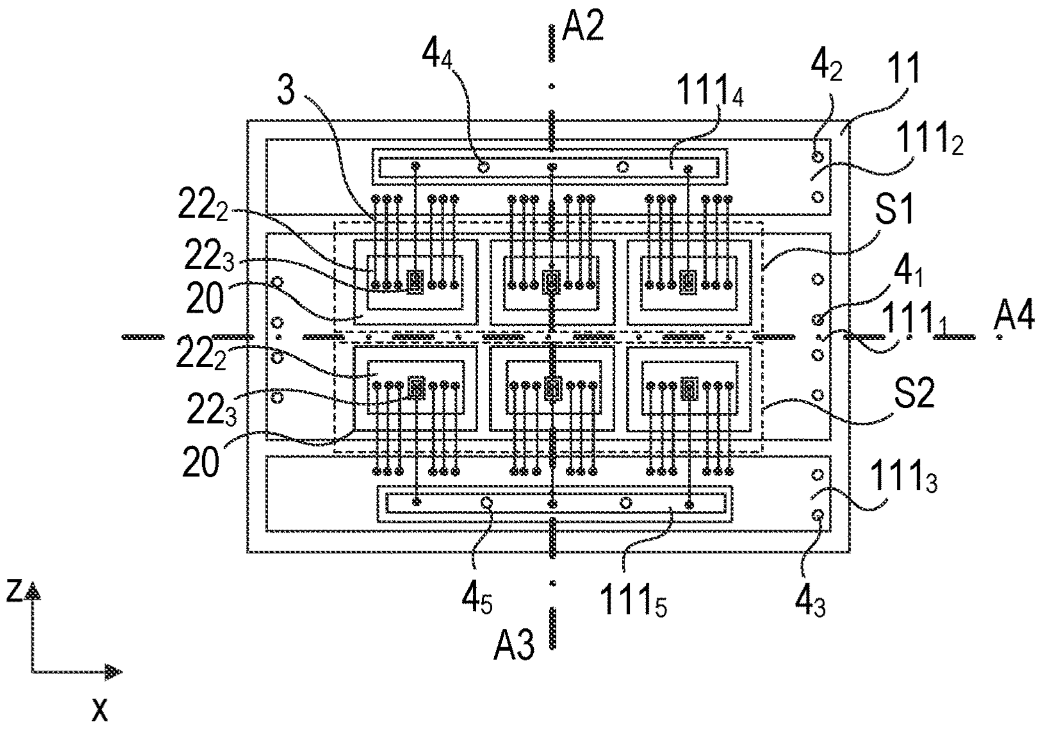
FIG. 5 schematically illustrates a semiconductor arrangement according to one or more implementations.
Figure 6:
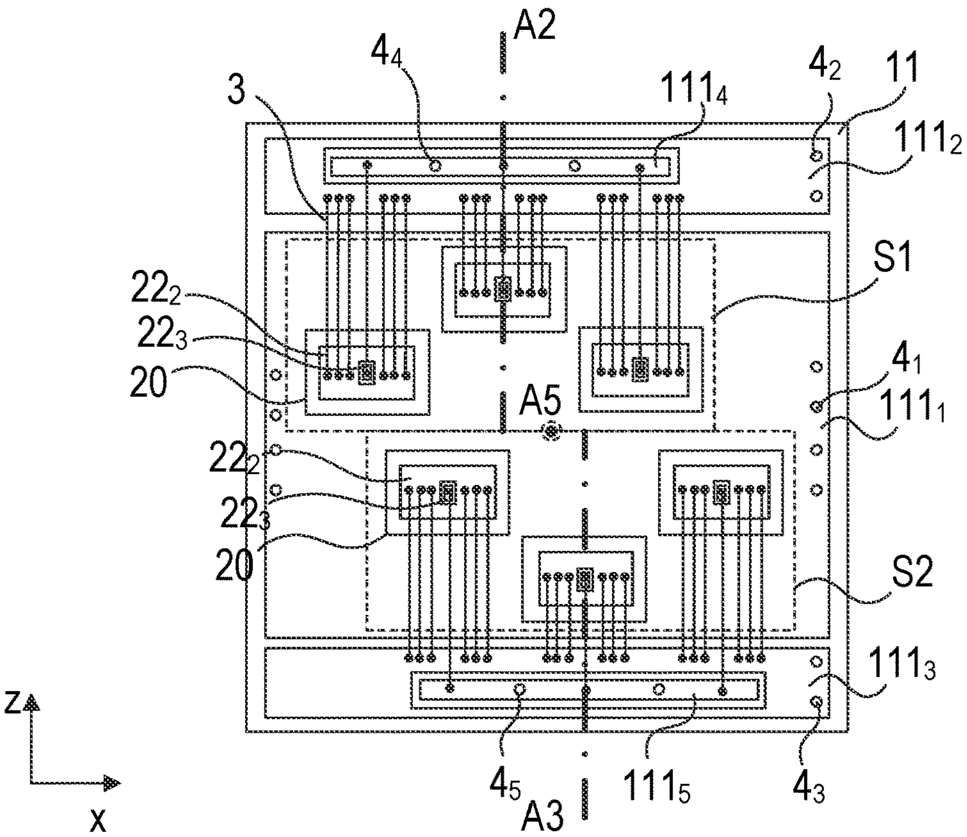
FIG. 6 schematically illustrates a semiconductor arrangement according to one or more implementations.

Now referring to FIGS. 4, 5 and 6, power semiconductor module arrangements according to implementations of the disclosure are schematically illustrated. A power semiconductor module arrangement according to implementations of the disclosure comprises a substrate 10 comprising a dielectric insulation layer 11 and a first metallization layer 111 arranged on a first side of the dielectric insulation layer 11, wherein the first metallization layer 111 comprises a plurality of different sections that are separate and distinct from each other. The power semiconductor module arrangement further comprises a plurality of semiconductor bodies 20 arranged on the first metallization layer 111, and comprising a first sub-group S1 of semiconductor bodies 20 and a second sub-group S2 of semiconductor bodies 20, wherein the semiconductor bodies 20 of the first sub-group S1 differ from the semiconductor bodies 20 of the second sub-group S2. Each of the plurality of semiconductor bodies 20 comprises a control electrode $\mathbf{22_3}$ and a controllable load path between a first load electrode (not visible in the top views of FIGS. 4, 5 and 6) and a second load electrode $\mathbf{22_2}$. The first load electrode of each of the plurality of semiconductor bodies 20 is electrically coupled to a first section $\mathbf{111_1}$ of the first metallization layer 111, the second load electrodes $\mathbf{22_2}$ of the semiconductor bodies 20 of the first sub-group S1 are electrically coupled to a second section $\mathbf{111_2}$, and the second load electrodes $\mathbf{22_2}$ of the semiconductor bodies 20 of the second sub-group S2 are electrically coupled to a third section $\mathbf{111_3}$ of the first metallization layer 111. The control electrodes $\mathbf{22_3}$ of the semiconductor bodies 20 of the first sub-group S1 are electrically coupled to a fourth section $\mathbf{111_4}$, and the control electrodes $\mathbf{22_3}$ of the semiconductor bodies 20 of the second sub-group S2 are electrically coupled to a fifth section $\mathbf{111_5}$ of the first metallization layer 111.

As is illustrated in the examples in FIGS. 5 and 6, the semiconductor bodies 20 of the first sub-group S1 may be arranged symmetrically about a first axis of symmetry A2, and the semiconductor bodies 20 of the second sub-group S2 may be arranged symmetrically about a second axis of symmetry A3. This, however, is optional, as will be described in further detail below. In any case, however, the first sub-group S1 is symmetrical to the second sub-group S2. The first sub-group S1 may be symmetrical to the second sub-group S2 about a third axis of symmetry A4 as is schematically illustrated in FIGS. 4 and 5, or the first sub-group S1 may be point symmetrical to the second sub-group S2 about a center of symmetry A5 as is schematically illustrated in FIG. 6. It is generally possible that the first sub-group S1 is symmetrical to the second sub-group S2 about any axis of symmetry A4 as well as about a center of symmetry A5. The first axis of symmetry A2 may be parallel to the second axis of symmetry A3. For example, the first axis of symmetry A2 and the second axis of symmetry A3 may correspond to each other, as is schematically illustrated in FIGS. 4 and 5. The first axis of symmetry A2 and the second axis of symmetry A3, however, may also be displaced with respect to each other, as is schematically illustrated in FIG. 6. The third axis of symmetry A4 may be perpendicular to each of the first axis of symmetry A2 and the second axis of symmetry A3, for example. It is, however, also possible that the third axis of symmetry A4 is parallel to each of the first axis of symmetry A2 and the second axis of symmetry A3 (not specifically illustrated).

The plurality of semiconductor bodies 20 may form a half-bridge arrangement, for example. The necessary electrical connections that are required to ensure a reliable operation of the power semiconductor arrangement, however, are only partly implemented within the power semiconductor module. One or more electrical connections are only provided by operatively coupling the respective electrodes of the semiconductor bodies 20 of the first sub-group S1 and of the semiconductor bodies 20 of the second sub-group S2 to the same electrical potential.

The semiconductor bodies 20 may be implemented as IGBTs (Insulated-Gate Bipolar Transistor), MOSFETs (Metal-Oxide-Semiconductor Field-Effect Transistor), JFETs (Junction Field-Effect Transistor), HEMTs (High-Electron-Mobility Transistor), and/or any other suitable controllable semiconductor elements, for example. That is, the first load electrodes of the plurality of semiconductor bodies 20 may be drain electrodes, the second load electrodes $\mathbf{22_2}$ of the semiconductor bodies 20 may be source electrodes, and the control electrodes $\mathbf{22_3}$ of the semiconductor bodies 20 may be gate electrodes. According to another example, the first load electrodes of the plurality of semiconductor bodies 20 may be collector electrode, the second load electrodes $\mathbf{22_2}$ of the semiconductor bodies 20 may be emitter electrodes, and the control electrodes $\mathbf{22_3}$ of the semiconductor bodies 20 may be base electrodes. According to one implementation of the disclosure, the plurality of semiconductor bodies 20 are all of the same kind. That is, each of the plurality of semiconductor bodies 20 may be or may comprise an IGBTs, for example. It is, however, also possible that the plurality of semiconductor bodies 20 comprises two different kinds of controllable semiconductor elements. According to one implementation of the disclosure, the semiconductor bodies 20 of the first sub-group S1 are implemented as IGBTs, and the semiconductor bodies 20 of the second sub-group S2 are implemented as MOSFETs. Any other combination of different controllable semiconductor elements is generally possible.

According to one example, the first load electrodes (e.g., drain or collector electrodes) of the semiconductor bodies 20 of the first sub-group S1 are electrically coupled to the first load electrodes (e.g., drain or collector electrodes) of the semiconductor bodies 20 of the second sub-group S2 within the power semiconductor module. "Within the power semiconductor module" in this context refers to an electrical connection inside a housing. In the examples illustrated in FIGS. 4, 5 and 6, this electrical connection is formed by arranging each of the plurality of semiconductor bodies 20 on one and the same section of the first metallization layer 111. In the figures, this section is designated as first section $\mathbf{111}_1$.

As has been described with respect to FIG. 1 above, a power semiconductor module arrangement may further comprise a housing 7, wherein the substrate 10 is arranged inside or forms a bottom of the housing 7, and a plurality of terminal elements 4, each comprising a first end 41 and a second end 42. As is schematically illustrated in FIGS. 5 and 6, the first end 41 of each of a first sub-group of terminal elements 41 may be electrically and mechanically coupled to the first section $\mathbf{111}_1$ of the first metallization layer 111, the first end 41 of each of a second sub-group of terminal elements 42 may be electrically and mechanically coupled to the second section $\mathbf{111}_2$ of the first metallization layer 111, the first end 41 of each of a third sub-group of terminal elements 43 may be electrically and mechanically coupled to the third section $\mathbf{111}_3$ of the first metallization layer 111, the first end 41 of each of a fourth sub-group of terminal elements 44 may be electrically and mechanically coupled to the fourth section $\mathbf{111}_4$ of the first metallization layer 111, and the first end 41 of each of a fifth sub-group of terminal elements 45 may be electrically and mechanically coupled to the fifth section $\mathbf{111}_5$ of the first metallization layer 111. The second end 42 of each of the plurality of terminal elements 4 extends to the outside of the housing 7, similar to what has been described with respect to FIG. 1 above. In this way, each of the different sections of the first metallization layer 111 can be electrically contacted individually.

In the implementations illustrated in the figures, there is no internal electrical connection between the second section $\mathbf{111}_2$ and the third section $\mathbf{111}_3$, and between the fourth section $\mathbf{111}_4$ and the fifth section $\mathbf{111}_5$, for example. That is, there are no electrical connection elements 3 that electrically couple the different sections to each other. An electrical connection between the control electrodes $\mathbf{22}_3$ of the semiconductor bodies 20 of the first sub-group S1 and the control electrodes $\mathbf{22}_3$ of the semiconductor bodies 20 of the second sub-group S2 can be implemented by operatively coupling the respective terminal elements 4 to the same potential. For example, the second ends 42 of the terminal elements of the first sub-group of terminal elements 41 may be configured to be operatively connected to a first electrical potential, the second ends 42 of the terminal elements of the second sub-group of terminal elements 42 may be configured to be operatively coupled to a second electrical potential that is different from the first electrical potential, and the second ends 42 of the terminal elements of the third sub-group of terminal elements 43 may be configured to be operatively coupled to the second electrical potential. According to one example, the first potential is a positive potential DC+, and the second potential is a negative potential DC−, or vice versa.

That is, the semiconductor arrangement is divided in two sub-groups (sub-systems), each of which may be symmetrical about an axis of symmetry. Further, the two sub-groups are symmetric to each other. At least some of the electrical connections that are required for the full functionality of the arrangement are not implemented in the module. Full functionality can only be achieved by connecting the respective terminal elements 4 to respective potentials. In this way, a highly symmetrical arrangement is achieved which, at the same time, may be implemented in a very space saving and, therefore, cost-effective way. Instead of mutually controlling the second load electrodes $\mathbf{22}_2$ of the semiconductor bodies 20 of the first sub-group S1 and the second load electrodes $\mathbf{22}_2$ of the semiconductor bodies 20 of the second sub-group S2, it is alternatively also possible that the second load electrodes $\mathbf{22}_2$ of the semiconductor bodies 20 of the first sub-group S1 and the second load electrodes $\mathbf{22}_2$ of the semiconductor bodies 20 of the second sub-group S2 are controlled individually. That is, it is possible that the second load electrodes $\mathbf{22}_2$ of the semiconductor bodies of the different sub-groups S1, S2 are not even operatively coupled to the same electrical potential. The same applies for the control electrodes $\mathbf{22}_3$ of the semiconductor bodies 20 of the first sub-group S1 and the control electrodes $\mathbf{22}_3$ of the semiconductor bodies 20 of the second sub-group S2, which may be controlled either mutually or individually. Individual control of the respective electrodes of the different sub-groups S1, S2 may be implemented using a so-called interleaved control, for example.

The symmetric design of the two sub-groups S1, S2 allows for a suitable and proper operation of each of the plurality of semiconductor bodies 20. As the final electrical connection between the two sub-groups S1, S2 is implemented outside of the power semiconductor module arrangement, external parasitic asymmetries may occur which, however, can easily be determined by determining the current of each sub-group independently and then comparing the currents to each other. Any marginal internal asymmetries that might arise due to design restrictions can be easily compensated using suitable adjustments of the respective control signals that are provided to the individual sub-groups. The control electrodes $\mathbf{22}_3$ of the semiconductor bodies 20 of the first sub-group S1 may be coupled to a first control circuit, while the control electrodes $\mathbf{22}_3$ of the semiconductor bodies 20 of the second sub-group S2 are coupled to a second control circuit in order to compensate such asymmetries. It is, however, also possible that the control electrodes $\mathbf{22}_3$ of the semiconductor bodies 20 of the first sub-group S1 are coupled to the same control circuit as the control electrodes $\mathbf{22}_3$ of the semiconductor bodies 20 of the second sub-group S2.

The general requirements concerning the symmetry of the overall semiconductor arrangement are divided and restricted by the two smaller sub-groups. Complex concepts such as, e.g., waveguide concepts, therefore, are reduced to a minimum. The reduction to smaller sub-groups allows the use of more aggressive or fast switching semiconductor elements, because a possible asymmetry is restricted to a smaller number of semiconductor elements. This, at least in some cases, may allow to do without additional gate resistors. The effective stray inductance of the overall semiconductor arrangement is about half as compared to conventional systems due to the symmetric design of the sub-groups and their parallel operation. That is, due to the symmetric connection of the sub-groups, the figure of merit FOM which is the current multiplied with the stray inductance is essentially constant.

Figure 7A:
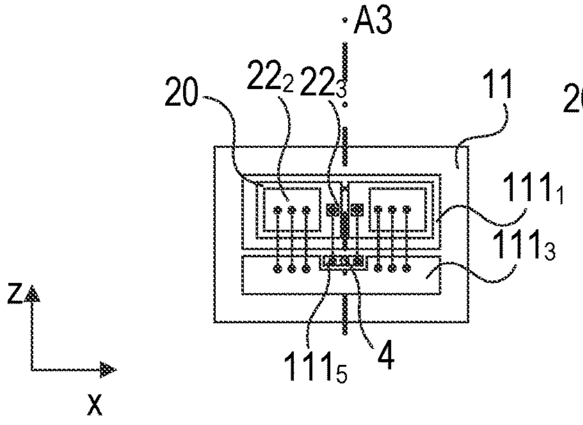
FIGS. 7A and 7B schematically illustrate first sub-groups of semiconductor bodies according to implementations of the disclosure.
Figure 7B:
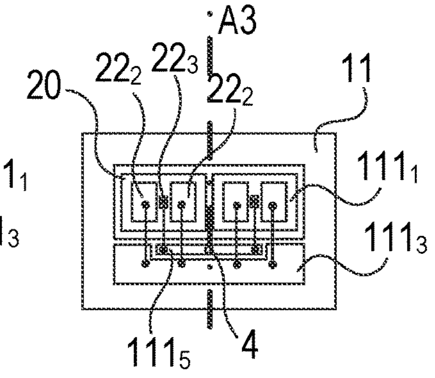

Now referring to FIGS. 7A and 7B, second sub-groups S2 according to implementations of the disclosure are schematically illustrated. The second sub-group S2 in both cases (FIGS. 7A and 7B) comprises two semiconductor bodies 20. As can be seen, the second load electrodes 22$_2$ and the control electrodes 22$_3$ can be arranged in different ways with respect to each other. In FIG. 7A, the second load electrode 22$_2$ of a semiconductor body 20 is arranged on one side of the semiconductor body 20, and the control electrode 22$_3$ is arranged on the other side of the semiconductor body. This is often referred to as side gate or edge gate. In order to achieve the desired symmetry, the control electrodes 22$_3$ of the two semiconductor bodies 20 are oriented towards each other. The second axis of symmetry A3 extends between the two semiconductor bodies 20. In FIG. 7B, the control electrode 22$_3$ of a semiconductor body 20 is arranged between two sections of the respective second load electrode 22$_2$. This is often referred to as middle gate. In this example, the second axis of symmetry A3 also extends between the two semiconductor bodies 20. Any other even number of semiconductor bodies 20 can be arranged similar to what is illustrated in FIGS. 7A and 7B.

Figure 8A:
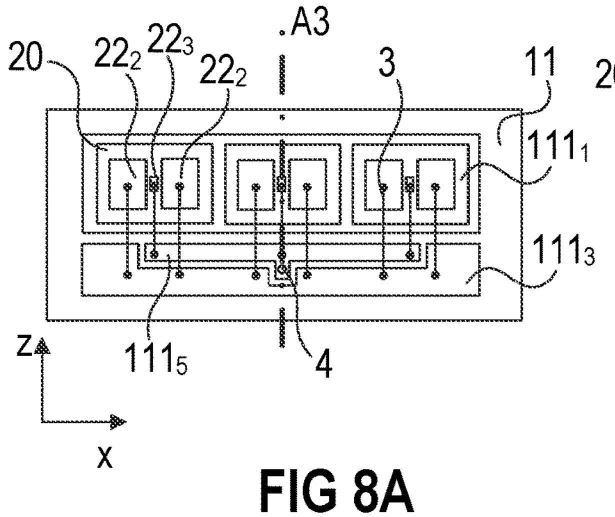
FIGS. 8A and 8B schematically illustrate first sub-groups of semiconductor bodies according to further implementations of the disclosure.
Figure 8B:
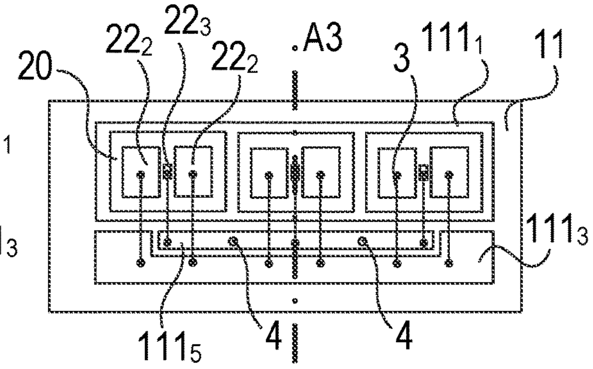

Now referring to FIGS. 8A and 8B, second sub-groups S2 according to further implementations of the disclosure are schematically illustrated. In the arrangement of FIG. 8A as well as in the arrangement of FIG. 8B middle gate semiconductor bodies 20 are used. In this way, the desired symmetry is achieved even if the number of semiconductor bodies 20 in each sub-group is uneven (three semiconductor bodies 20 in the example of FIGS. 8A and 8B). When a sub-group S1, S2 comprises an uneven number of semiconductor bodies 20, the axis of symmetry A3 extends centrally through the central semiconductor body 20 in a row of semiconductor bodies 20. Marginal asymmetries could arise when using side gate semiconductor bodies 20 in a sub-group comprising an uneven number of semiconductor bodies 20. In the example illustrated in FIG. 8A, the fifth section 111$_5$ of the first metallization layer 111 is contacted using one terminal element 4. This terminal element 4 is arranged centrally on the fifth section 111$_5$, in order to achieve the desired symmetry of the currents. In the example illustrated in FIG. 8B, two terminal elements 4 are arranged on the fifth section 111$_5$ and symmetrically about the second axis of symmetry A3 to achieve the desired symmetry of the currents flowing in the semiconductor arrangement. In this way, any other number of terminal elements 4 may be arranged on the fifth section 111$_5$.

Figure 9A:
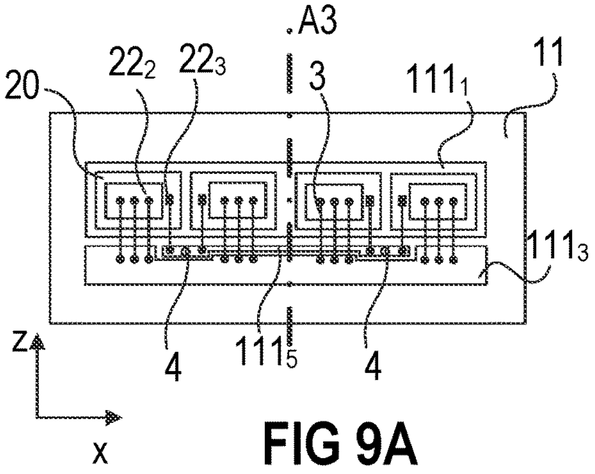
FIGS. 9A and 9B schematically illustrate first sub-groups of semiconductor bodies according to even further implementations of the disclosure.
Figure 9B:
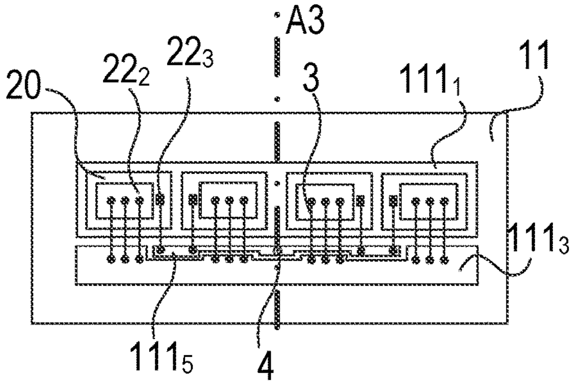

Now referring to FIGS. 9A and 9B, second sub-groups S2 according to even further implementations of the disclosure are schematically illustrated. The second sub-groups S2 in these examples each comprise four side gate semiconductor bodies 20. The semiconductor bodies 20 are arranged in pairs, with the control electrodes 22$_3$ of the semiconductor bodies 20 of each pair oriented towards each other. It is, however, also possible to use middle gate semiconductor bodies 20, as has been described with respect to FIG. 7B above. FIG. 9A schematically illustrates a second sub-group S2 with two terminal elements 4 arranged on the fifth section 111$_5$, similar to what has been described with respect to FIG. 8B above. FIG. 9B schematically illustrates a second sub-group S2 with one terminal element 4 arranged centrally on the fifth section 111$_5$, similar to what has been described with respect to FIG. 8A above. When using two terminal elements 4 instead of one, the stray inductance may be decreased as compared to an arrangement comprising only one terminal element. In FIGS. 7A, 7B, 8A, 8B, 9A, and 9B terminal elements contacting the first section 111$_1$ and the third section 111$_3$ are not explicitly illustrated for clarity reasons only.

As is illustrated in the figures, the first load electrode of each of the plurality of semiconductor bodies 20 may be electrically coupled to the first section 111$_1$ of the first metallization layer 111 using an electrically conductive connection layer 30, similar to what has been described with respect to FIG. 1 above. The second load electrodes 22$_2$ of the semiconductor bodies 20 of the first sub-group S1 may be electrically coupled to the second section 111$_2$ using one or more electrical connection elements 3, e.g., bonding wires, bonding ribbons, connection plates, conductor rails, or connection clips. The second load electrodes 22$_2$ of the semiconductor bodies 20 of the second sub-group S2 may be electrically coupled to the third section 111$_3$ using one or more electrical connection elements 3, the control electrodes 22$_3$ of the semiconductor bodies 20 of the first sub-group S1 may be electrically coupled to the fourth section 111$_4$ using one or more electrical connection elements 3, and the control electrodes 22$_3$ of the semiconductor bodies 20 of the second sub-group S2 may be electrically coupled to the fifth section 111$_5$ using one or more electrical connection elements 3.

Again referring to FIGS. 5 and 6, the first section 111$_1$ of the first metallization layer 111 may be arranged between the second section 111$_2$ and the third section 111$_3$ of the first metallization layer 111. The fourth section 111$_4$ may be surrounded by the second section 111$_2$, and the fifth section 111$_5$ may be surrounded by the third section 111$_3$. The fourth section 111$_4$, however, may instead be arranged between the second section 111$_2$ and the first section 111$_1$, and the fifth section 111$_5$ may be arranged between the third section 111$_3$ and the first section 111$_1$, as is schematically illustrated in FIGS. 7, 8 and 9. In all of these cases, a symmetry of the different sections of the first metallization layer about the third axis of symmetry A4 or about the center of symmetry A5 can be achieved. That is, not only the semiconductor bodies 20 themselves, but also any other components such as, e.g., sections of the first metallization layer 111, terminal elements 4, electrical connection elements 3, etc., may be arranged symmetrically on the substrate 10. The different sections of the first metallization layer 111 may each have a rectangular cross-section, as is schematically illustrated in FIGS. 7A, 7B, 8A, 8B, 9A, and 9B, for example. Any other cross-sections, however, are generally also possible.

As is schematically illustrated in FIG. 4, the power semiconductor module arrangement may further comprise a plurality of freewheeling elements 80 arranged on the first metallization layer 111, and comprising a first sub-group of freewheeling elements 80 and a second sub-group of freewheeling elements 80, wherein the freewheeling elements 80 of the first sub-group differ from the freewheeling elements 80 of the second sub-group. The first sub-group of freewheeling elements 80 may be electrically coupled to the first sub-group S1 of semiconductor bodies 20, and the second sub-group of freewheeling elements 80 may be electrically coupled to the second sub-group S2 of semiconductor bodies 20.

As can be seen in FIG. 4, according to implementations of the disclosure it is also possible that the semiconductor bodies 20 of the first sub-group S1 are not arranged strictly symmetrical about an axis of symmetry, and the semiconductor bodies 20 of the second sub-group S2 are not arranged strictly symmetrical about an axis of symmetry. In the example illustrated in FIG. 4, there are slight deviations from a strict symmetry. That is, some of the semiconductor bodies 20 may be (slightly) moved out of a strictly symmetrical arrangement. Generally, it is desirable that the two sub-groups S1, S2 have (quasi-) symmetrical current characteristics. Symmetrical current characteristics (electrical symmetry) of the two sub-groups S1, S2, however, can also be achieved even if the semiconductor bodies 20 of each of the sub-groups S1, S2 are not arranged strictly symmetrical. A symmetry of the semiconductor bodies 20 of each sub-group S1, S2 about respective axes of symmetry (e.g., first axis of symmetry A2, second axis of symmetry A3), however, generally results in highly symmetrical current characteristics (see, e.g., FIG. 5).

It is generally possible that the freewheeling elements 80 illustrated in FIG. 4 are not arranged symmetrically in any way. To further increase the symmetry of the overall power semiconductor module arrangement however, the freewheeling elements 80 of the first sub-group may be arranged symmetrically about the first axis of symmetry A2, and the freewheeling elements 80 of the second sub-group may be arranged symmetrically about the second axis of symmetry A3. The first sub-group of freewheeling elements 80 may be symmetrical to the second sub-group of freewheeling elements 80. Each of the freewheeling elements 80 may be or may comprise a diode, for example.

It is generally also possible that a power semiconductor module arrangement comprises more than two sub-groups. For example, a power semiconductor module arrangement can comprise four or even more sub-groups. For symmetry reasons, an even number of sub-groups may be chosen. It is, however, generally also possible to achieve a desired symmetry for a power semiconductor module arrangement comprising an uneven number of sub-groups. Each sub-group may comprise an even number or an uneven number of semiconductor bodies 20. Semiconductor bodies 20 with a side gate or middle gate configuration may be used as appropriate, in order to achieve the desired symmetry. Even if the number of semiconductor bodies 20 for each sub-group is generally not restricted in any way, it may be advantageous to keep the number of semiconductor bodies 20 per sub-group as low as possible and rather divide the plurality of semiconductor bodies 20 in a larger number of sub-groups. For example, the number of semiconductor bodies 20 per sub-group may be two, three, or four. This applies for power semiconductor module arrangements comprising two sub-groups as well as for power semiconductor module arrangements comprising more than two sub-groups.

Further, as can be seen in FIG. 4, for example, a power semiconductor module arrangement may comprise additional semiconductor bodies 20 that are not included in the first sub-group S1 or the second sub-group S2 (see semiconductor bodies 20 on left side of FIG. 4). Such semiconductor bodies 20 may be arranged on additional sections of the first metallization layer 111, for example, that are separate and distinct from each of the first, second, third, fourth and fifth section $\mathbf{111_1}$, $\mathbf{111_2}$, $\mathbf{111_3}$, $\mathbf{111_4}$, $\mathbf{111_5}$ of the first metallization layer 111.

ASPECTS

The following provides an overview of some Aspects of the present disclosure:

Aspect 1: A power semiconductor module arrangement, comprising: a substrate comprising a dielectric insulation layer and a first metallization layer arranged on a first side of the dielectric insulation layer, wherein the first metallization layer comprises a plurality of different sections that are separate and distinct from each other; and a plurality of semiconductor bodies arranged on the first metallization layer, and comprising a first sub-group of semiconductor bodies and a second sub-group of semiconductor bodies, wherein semiconductor bodies of the first sub-group of semiconductor bodies differ from semiconductor bodies of the second sub-group of semiconductor bodies, wherein each of the plurality of semiconductor bodies comprises a control electrode and a controllable load path between a first load electrode and a second load electrode, wherein the first load electrode of each of the plurality of semiconductor bodies is electrically coupled to a first section of the first metallization layer, wherein the second load electrode of each of the semiconductor bodies of the first sub-group of semiconductor bodies are electrically coupled to a second section of the first metallization layer, and the second load electrode of each of the semiconductor bodies of the second sub-group of semiconductor bodies are electrically coupled to a third section of the first metallization layer, wherein the control electrode of each of the semiconductor bodies of the first sub-group of semiconductor bodies are electrically coupled to a fourth section of the first metallization layer, and the control electrode of each of the semiconductor bodies of the second sub-group of semiconductor bodies are electrically coupled to a fifth section of the first metallization layer, and wherein the first sub-group of semiconductor bodies is symmetrical to the second sub-group of semiconductor bodies.

Aspect 2: The power semiconductor module arrangement of Aspect 1, wherein the semiconductor bodies of the first sub-group of semiconductor bodies are arranged symmetrically about a first axis of symmetry, and the semiconductor bodies of the second sub-group of semiconductor bodies are arranged symmetrically about a second axis of symmetry.

Aspect 3: The power semiconductor module arrangement of any of Aspects 1-2, further comprising: a housing, wherein the substrate is arranged inside or forms a bottom of the housing; a plurality of terminal elements, each comprising a first end and a second end, wherein the first end of each of a first sub-group of terminal elements is electrically and mechanically coupled to the first section of the first metallization layer, wherein the first end of each of a second sub-group of terminal elements is electrically and mechanically coupled to the second section of the first metallization layer, wherein the first end of each of a third sub-group of terminal elements is electrically and mechanically coupled to the third section of the first metallization layer, wherein the first end of each of a fourth sub-group of terminal elements is electrically and mechanically coupled to the fourth section of the first metallization layer, wherein the first end of each of a fifth sub-group of terminal elements is electrically and mechanically coupled to the fifth section of the first metallization layer, and wherein the second end of each of the plurality of terminal elements extends to an outside of the housing.

Aspect 4: The power semiconductor module arrangement of Aspect 3, wherein: wherein the second end of each of the plurality of terminal elements of the first sub-group of terminal elements is configured to be operatively connected to a first electrical potential, wherein the second end of each of the plurality of terminal elements of the second sub-group of terminal elements is configured to be operatively coupled to a second electrical potential that is different from the first electrical potential, and wherein the second end of each of the plurality of terminal elements of the third sub-group of terminal elements is configured to be operatively coupled to the second electrical potential.

Aspect 5: The power semiconductor module arrangement of any of Aspects 1-4, wherein: the first load electrode of each of the plurality of semiconductor bodies is electrically coupled to the first section using an electrically conductive connection layer, the second load electrode of each of the semiconductor bodies of the first sub-group of semiconductor bodies are electrically coupled to the second section using one or more electrical connection elements, the second load electrode of the semiconductor bodies of the second sub-group of semiconductor bodies are electrically coupled to the third section using one or more electrical connection elements, the control electrode of each of the semiconductor bodies of the first sub-group of semiconductor bodies are electrically coupled to the fourth section using one or more electrical connection elements, and the control electrode of each of the semiconductor bodies of the second sub-group of semiconductor bodies are electrically coupled to the fifth section using one or more electrical connection elements.

Aspect 6: The power semiconductor module arrangement of Aspect 5, wherein an electrical connection element comprises a bonding wire, a bonding ribbon, a connection plate, a conductor rail, or a connection clip.

Aspect 7: The power semiconductor module arrangement of any of Aspects 1-6, wherein: the first load electrode of each of the plurality of semiconductor bodies is a drain electrode, the second load electrode of each of the plurality of semiconductor bodies is a source electrode, and the control electrode of each of the plurality of semiconductor bodies is a gate electrode, or the first load electrode of each of the plurality of semiconductor bodies is a collector electrode, the second load electrode of each of the plurality of semiconductor bodies is an emitter electrode, and the control electrode of each of the plurality of semiconductor bodies is a base electrode.

Aspect 8: The power semiconductor module arrangement of any of Aspects 1-7, wherein the first section is arranged between the second section and the third section of the first metallization layer.

Aspect 9: The power semiconductor module arrangement of Aspect 8, wherein: the fourth section is arranged between the second section and the first section, and the fifth section is arranged between the third section and the first section.

Aspect 10: The power semiconductor module arrangement of any of Aspects 1-9, wherein the first sub-group of semiconductor bodies and the second sub-group of semiconductor bodies each comprise an even number of semiconductor bodies.

Aspect 11: The power semiconductor module arrangement of any of Aspects 1-10, wherein the first sub-group of semiconductor bodies and the second sub-group of semiconductor bodies each comprise an uneven number of semiconductor bodies.

Aspect 12: The power semiconductor module arrangement of Aspect 2, wherein the first sub-group of semiconductor bodies is symmetrical to the second sub-group of semiconductor bodies about a third axis of symmetry.

Aspect 13: The power semiconductor module arrangement of Aspect 12, wherein the third axis of symmetry is perpendicular to each of the first axis of symmetry and the second axis of symmetry.

Aspect 14: The power semiconductor module arrangement of any of Aspects 1-13, wherein the first sub-group of semiconductor bodies is point symmetrical to the second sub-group of semiconductor bodies about a center of symmetry.

Aspect 15: The power semiconductor module arrangement of any of Aspects 1-14, further comprising a plurality of freewheeling elements arranged on the first metallization layer, and comprising a first sub-group of freewheeling elements and a second sub-group of freewheeling elements, wherein freewheeling elements of the first sub-group differ of freewheeling elements from freewheeling elements of the second sub-group of freewheeling elements, wherein: the first sub-group of freewheeling elements is electrically coupled to the first sub-group of semiconductor bodies, and the second sub-group of freewheeling elements is electrically coupled to the second sub-group of semiconductor bodies.

Aspect 16: The power semiconductor module arrangement of Aspect 15, wherein: the freewheeling elements of the first sub-group of freewheeling elements are arranged symmetrically about a first axis of symmetry, and the freewheeling elements of the second sub-group of freewheeling elements are arranged symmetrically about a second axis of symmetry, and the first sub-group of freewheeling elements is symmetrical to the second sub-group of freewheeling elements.

Aspect 17: A system configured to perform one or more operations recited in one or more of Aspects 1-16.

Aspect 18: An apparatus comprising means for performing one or more operations recited in one or more of Aspects 1-16.

The invention claimed is:

1. A power semiconductor module arrangement, comprising:

a substrate comprising a dielectric insulation layer and a first metallization layer arranged on a first side of the dielectric insulation layer, wherein the first metallization layer comprises a plurality of different sections that are separate and distinct from each other; and a plurality of semiconductor bodies arranged on the first metallization layer, and comprising a first sub-group of semiconductor bodies and a second sub-group of semiconductor bodies, wherein semiconductor bodies of the first sub-group of semiconductor bodies differ from semiconductor bodies of the second sub-group of semiconductor bodies, wherein each of the plurality of semiconductor bodies comprises a control electrode and a controllable load path between a first load electrode and a second load electrode, wherein the first load electrode of each of the plurality of semiconductor bodies is electrically coupled to a first section of the first metallization layer, wherein the second load electrode of each of the semiconductor bodies of the first sub-group of semiconductor bodies are electrically coupled to a second section of the first metallization layer, and the second load electrode of each of the semiconductor bodies of the second sub-group of semiconductor bodies are electrically coupled to a third section of the first metallization layer, wherein the control electrode of each of the semiconductor bodies of the first sub-group of semiconductor bodies are electrically coupled to a fourth section of the first metallization layer, and the control electrode of each of the semiconductor bodies of the second sub-group of semiconductor bodies are electrically coupled to a fifth section of the first metallization layer, wherein the first sub-group of semiconductor bodies is symmetrical to the second sub-group of semiconductor bodies, wherein the fourth section of the first metallization layer is laterally surrounded by the second section of the first metallization layer such that the fourth section of the first metallization layer is not in contact with the first section and the second section of the first metallization layer, or the fourth section of the first metallization layer is arranged laterally between the first section of the first metallization layer and the second section of the first metallization layer such that the fourth section of the first metallization layer is not in contact with the first section and the second section of the first metallization layer, and wherein the fifth section of the first metallization layer is laterally surrounded by the third section of the first metallization layer such that the fifth section of the first metallization layer is not in contact with the first section and the third section of the first metallization layer, or the fifth section of the first metallization layer is arranged laterally between the first section of the first metallization layer and the third section of the first metallization layer such that the fifth section of the first metallization layer is not in contact with the first section and the third section of the first metallization layer.

2. The power semiconductor module arrangement of claim 1, wherein the semiconductor bodies of the first sub-group of semiconductor bodies are arranged symmetrically about a first axis of symmetry, and the semiconductor bodies of the second sub-group of semiconductor bodies are arranged symmetrically about a second axis of symmetry.

3. The power semiconductor module arrangement of claim 2, wherein the first sub-group of semiconductor bodies is symmetrical to the second sub-group of semiconductor bodies about a third axis of symmetry.

4. The power semiconductor module arrangement of claim 3, wherein the third axis of symmetry is perpendicular to each of the first axis of symmetry and the second axis of symmetry.

5. The power semiconductor module arrangement of claim 1, wherein:

the first load electrode of each of the plurality of semiconductor bodies is electrically coupled to the first section using an electrically conductive connection layer, the second load electrode of each of the semiconductor bodies of the first sub-group of semiconductor bodies are electrically coupled to the second section of the first metallization layer using one or more electrical connection elements, the second load electrode of the semiconductor bodies of the second sub-group of semiconductor bodies are electrically coupled to the third section of the first metallization layer using one or more electrical connection elements, the control electrode of each of the semiconductor bodies of the first sub-group of semiconductor bodies are electrically coupled to the fourth section of the first metallization layer using one or more electrical connection elements, and the control electrode of each of the semiconductor bodies of the second sub-group of semiconductor bodies are electrically coupled to the fifth section of the first metallization layer using one or more electrical connection elements.

6. The power semiconductor module arrangement of claim 5, wherein an electrical connection element comprises a bonding wire, a bonding ribbon, a connection plate, a conductor rail, or a connection clip.

7. The power semiconductor module arrangement of claim 1, wherein:

the first load electrode of each of the plurality of semiconductor bodies is a drain electrode, the second load electrode of each of the plurality of semiconductor bodies is a source electrode, and the control electrode of each of the plurality of semiconductor bodies is a gate electrode, or the first load electrode of each of the plurality of semiconductor bodies is a collector electrode, the second load electrode of each of the plurality of semiconductor bodies is an emitter electrode, and the control electrode of each of the plurality of semiconductor bodies is a base electrode.

8. The power semiconductor module arrangement of claim 1, wherein the first section is arranged between the second section and the third section of the first metallization layer.

9. The power semiconductor module arrangement of claim 8, wherein:

the fourth section is arranged between the second section and the first section, and the fifth section is arranged between the third section and the first section.

10. The power semiconductor module arrangement of claim 1, wherein the first sub-group of semiconductor bodies and the second sub-group of semiconductor bodies each comprise an even number of semiconductor bodies.

11. The power semiconductor module arrangement of claim 1, wherein the first sub-group of semiconductor bodies and the second sub-group of semiconductor bodies each comprise an uneven number of semiconductor bodies.

12. The power semiconductor module arrangement of claim 1, wherein the first sub-group of semiconductor bodies is point symmetrical to the second sub-group of semiconductor bodies about a center of symmetry.

13. The power semiconductor module arrangement of claim 1, wherein there is no internal electrical connection between the second section and the third section of the first metallization layer, and wherein there is no internal electrical connection between the fourth section and the fifth section of the first metallization layer.

14. A power semiconductor module arrangement, comprising:

a substrate comprising a dielectric insulation layer and a first metallization layer arranged on a first side of the dielectric insulation layer, wherein the first metallization layer comprises a plurality of different sections that are separate and distinct from each other; and a plurality of semiconductor bodies arranged on the first metallization layer, and comprising a first sub-group of semiconductor bodies and a second sub-group of semiconductor bodies, wherein semiconductor bodies of the first sub-group of semiconductor bodies differ from semiconductor bodies of the second sub-group of semiconductor bodies, wherein each of the plurality of semiconductor bodies comprises a control electrode and a controllable load path between a first load electrode and a second load electrode, wherein the first load electrode of each of the plurality of semiconductor bodies is electrically coupled to a first section of the first metallization layer, wherein the second load electrode of each of the semiconductor bodies of the first sub-group of semiconductor bodies are electrically coupled to a second section of the first metallization layer, and the second load electrode of each of the semiconductor bodies of the second sub-group of semiconductor bodies are electrically coupled to a third section of the first metallization layer, wherein the control electrode of each of the semiconductor bodies of the first sub-group of semiconductor bodies are electrically coupled to a fourth section of the first metallization layer, and the control electrode of each of the semiconductor bodies of the second sub-group of semiconductor bodies are electrically coupled to a fifth section of the first metallization layer, wherein the first sub-group of semiconductor bodies is symmetrical to the second sub-group of semiconductor bodies, and wherein the power semiconductor module arrangement further comprises:

a housing, wherein the substrate is arranged inside or forms a bottom of the housing; and a plurality of terminal elements, each comprising a first end and a second end, wherein the first end of each of a first sub-group of terminal elements is electrically and mechanically coupled to the first section of the first metallization layer, wherein the first end of each of a second sub-group of terminal elements is electrically and mechanically coupled to the second section of the first metallization layer, wherein the first end of each of a third sub-group of terminal elements is electrically and mechanically coupled to the third section of the first metallization layer, wherein the first end of each of a fourth sub-group of terminal elements is electrically and mechanically coupled to the fourth section of the first metallization layer, wherein the first end of each of a fifth sub-group of terminal elements is electrically and mechanically coupled to the fifth section of the first metallization layer, and wherein the second end of each of the plurality of terminal elements extends to an outside of the housing.

15. The power semiconductor module arrangement of claim 14, wherein:

wherein the second end of each of the plurality of terminal elements of the first sub-group of terminal elements is configured to be operatively connected to a first electrical potential, wherein the second end of each of the plurality of terminal elements of the second sub-group of terminal elements is configured to be operatively coupled to a second electrical potential that is different from the first electrical potential, and wherein the second end of each of the plurality of terminal elements of the third sub-group of terminal elements is configured to be operatively coupled to the second electrical potential.

16. A power semiconductor module arrangement, comprising:

a substrate comprising a dielectric insulation layer and a first metallization layer arranged on a first side of the dielectric insulation layer, wherein the first metallization layer comprises a plurality of different sections that are separate and distinct from each other; and a plurality of semiconductor bodies arranged on the first metallization layer, and comprising a first sub-group of semiconductor bodies and a second sub-group of semiconductor bodies, wherein semiconductor bodies of the first sub-group of semiconductor bodies differ from semiconductor bodies of the second sub-group of semiconductor bodies, wherein each of the plurality of semiconductor bodies comprises a control electrode and a controllable load path between a first load electrode and a second load electrode, wherein the first load electrode of each of the plurality of semiconductor bodies is electrically coupled to a first section of the first metallization layer, wherein the second load electrode of each of the semiconductor bodies of the first sub-group of semiconductor bodies are electrically coupled to a second section of the first metallization layer, and the second load electrode of each of the semiconductor bodies of the second sub-group of semiconductor bodies are electrically coupled to a third section of the first metallization layer, wherein the control electrode of each of the semiconductor bodies of the first sub-group of semiconductor bodies are electrically coupled to a fourth section of the first metallization layer, and the control electrode of each of the semiconductor bodies of the second sub-group of semiconductor bodies are electrically coupled to a fifth section of the first metallization layer, wherein the first sub-group of semiconductor bodies is symmetrical to the second sub-group of semiconductor bodies, and wherein the power semiconductor module arrangement further comprises a plurality of freewheeling elements arranged on the first metallization layer, and comprising a first sub-group of freewheeling elements and a second sub-group of freewheeling elements, wherein freewheeling elements of the first sub-group of freewheeling elements differ from freewheeling elements of the second sub-group of freewheeling elements, wherein:

the first sub-group of freewheeling elements is electrically coupled to the first sub-group of semiconductor bodies, and the second sub-group of freewheeling elements is electrically coupled to the second sub-group of semiconductor bodies.

17. The power semiconductor module arrangement of claim 16, wherein:

the freewheeling elements of the first sub-group of freewheeling elements are arranged symmetrically about a first axis of symmetry, and the freewheeling elements of the second sub-group of freewheeling elements are arranged symmetrically about a second axis of symmetry, and the first sub-group of freewheeling elements is symmetrical to the second sub-group of freewheeling elements.

* * * * *